US010913995B2

(12) United States Patent
Dominico et al.

(10) Patent No.: US 10,913,995 B2
(45) Date of Patent: Feb. 9, 2021

(54) PRETREATMENT ASSEMBLY AND METHOD FOR TREATING WORK PIECES

(71) Applicant: Stolle Machinery Company, LLC, Centennial, CO (US)

(72) Inventors: James W. Dominico, Kinnelon, NJ (US); Weniek (Rex) E. Jablonski, Randolph, NJ (US); Russell DiDonato, Union, NJ (US); Leonard A. VerHoven, Castle Rock, CO (US)

(73) Assignee: Stolle Machinery Company, LLC, Centennial, CO (US)

( * ) Notice: Subject to any disclaimer, the term of this patent is extended or adjusted under 35 U.S.C. 154(b) by 516 days.

(21) Appl. No.: 15/650,005

(22) Filed: Jul. 14, 2017

(65) Prior Publication Data
US 2019/0017160 A1    Jan. 17, 2019

(51) Int. Cl.
| | |
|---|---|
| *C23C 16/02* | (2006.01) |
| *H01J 37/32* | (2006.01) |
| *B41J 11/00* | (2006.01) |
| *C23C 4/02* | (2006.01) |
| *B05C 1/00* | (2006.01) |
| *B05D 7/02* | (2006.01) |

(Continued)

(52) U.S. Cl.
CPC ............... *C23C 4/02* (2013.01); *B05C 1/00* (2013.01); *C23C 16/02* (2013.01); *H01J 37/32403* (2013.01); *H01J 37/32733* (2013.01); *H01J 37/32761* (2013.01); *H01J 37/32779* (2013.01); *B05D 3/002* (2013.01); *B05D 7/02* (2013.01); *B05D 2258/02* (2013.01); *B41J 11/0015* (2013.01); *H01T 19/00* (2013.01)

(58) Field of Classification Search
None
See application file for complete search history.

(56) References Cited

U.S. PATENT DOCUMENTS 2,330,880 A * 10/1943 Gladfelter ........... B05B 13/0242
118/313
3,645,201 A     2/1972 Jackson
(Continued)

OTHER PUBLICATIONS

Stolle Machinery Company, LLC, PCT/US2018/41554, International Search Report, dated Sep. 20, 2018, 9 pages.

*Primary Examiner* — Binus Thomas
(74) *Attorney, Agent, or Firm* — Eckert Seamans Cherin & Mellott LLC

(57) ABSTRACT

A pretreatment assembly includes a product support assembly and a pretreatment device. The product support assembly includes a primary support assembly, a primary drive assembly, a number of secondary support assemblies, and a secondary drive assembly. The primary drive assembly is operatively coupled to the primary support assembly. The primary drive assembly imparts a generally constant motion to the primary support assembly. Each secondary support assembly is structured to support a number of work pieces. Each secondary support assembly is movably coupled to the primary support assembly. The secondary drive assembly is operatively coupled to each secondary support assembly. The secondary drive assembly selectively imparts a motion to each secondary support assembly. The pretreatment device is disposed adjacent the product support assembly.

20 Claims, 6 Drawing Sheets

(51) Int. Cl.
 *B05D 3/00* (2006.01)
 *H01T 19/00* (2006.01)

(56) References Cited

U.S. PATENT DOCUMENTS

| | | | |
|---|---|---|---|
| 3,802,380 A * | 4/1974 | Ford | B05B 5/084 |
| | | | 118/679 |
| 4,543,883 A | 10/1985 | Skrypek et al. | |
| 5,337,659 A | 8/1994 | Whelan | |
| 5,970,865 A | 10/1999 | Horth et al. | |
| 5,989,644 A * | 11/1999 | Williams | B05B 13/0235 |
| | | | 118/321 |
| 6,245,386 B1 * | 6/2001 | Felker | B05C 13/00 |
| | | | 427/258 |
| 6,337,487 B1 * | 1/2002 | Dubuit | B41F 15/0872 |
| | | | 250/453.11 |
| 6,491,755 B1 * | 12/2002 | Meinke | B05B 13/0228 |
| | | | 118/320 |
| 6,769,357 B1 * | 8/2004 | Finan | B41J 3/4073 |
| | | | 101/38.1 |
| 9,132,664 B2 | 9/2015 | Schach | |
| 2005/0046648 A1 | 3/2005 | Dumenil | |
| 2008/0136309 A1 * | 6/2008 | Chu | H01J 27/146 |
| | | | 313/361.1 |
| 2009/0020024 A1 | 1/2009 | Campioli et al. | |
| 2010/0313771 A1 | 12/2010 | Ferrari et al. | |
| 2011/0232514 A1 * | 9/2011 | Putzer | B41J 3/40733 |
| | | | 101/36 |
| 2011/0285768 A1 | 11/2011 | Preckel | |
| 2012/0017783 A1 * | 1/2012 | Uptergrove | B41J 3/4073 |
| | | | 101/38.1 |
| 2012/0188299 A1 | 7/2012 | Seki et al. | |
| 2013/0019566 A1 | 1/2013 | Schach | |
| 2015/0004320 A1 * | 1/2015 | Perret | B41J 3/4073 |
| | | | 118/500 |
| 2015/0033965 A1 | 2/2015 | Knott et al. | |
| 2015/0059600 A1 | 3/2015 | Heidrich et al. | |
| 2016/0236483 A1 * | 8/2016 | Till | B41J 3/4073 |
| 2017/0087872 A1 * | 3/2017 | Vella | B41J 3/4073 |

* cited by examiner

PRETREATMENT ASSEMBLY AND METHOD FOR TREATING WORK PIECES

BACKGROUND OF THE INVENTION

Field of the Invention

The disclosed and claimed concept relates to a pretreatment assembly structured to expose a printable substrate on a work piece to ions and, more specifically, a pretreatment apparatus wherein the work pieces are constantly in motion.

Background Information

Certain substrates such as, but not limited to, polymers, have inert surfaces that do not react well with coatings such as, but not limited to, adhesives and inks. The interaction between such substrates and various coatings can be improved by ionizing the substrate. Ionization is accomplished by exposing the substrate to a flame, plasma, or a corona discharge. Further, the surface to be treated is, typically, formed into a work piece or product prior to being treated. The following discussion will use plastic cups as an exemplary product that is to be treated prior to having an ultraviolet (UV) curable ink applied thereto. It is understood that, unless specified otherwise, the disclosed apparatus and method may be used with any type of work piece or product and to treat any type of coating or other surface characteristic.

Initially, a material is formed into a number of work pieces which, in this example, are plastic cups. prior to applying a coating, which in this example, is a UV curable ink, the external surface of the cups is ionized in this example by exposure to a corona discharge. The corona discharge is generated by a plate having energy passed therethrough. The cups are disposed on a carrier and passed close to the corona discharge plate. In one example, the carrier is a rotating mandrel disposed on a conveyor. That is, a cup is disposed over a mandrel sized and shaped to correspond to the inner surface of the cup. The conveyor moves the mandrel supporting the cup adjacent the corona discharge plate. The mandrel is then rotated so that all of the outer surface of the cup is exposed to the corona discharge. To ensure that all of the cup outer surface is adequately ionized, the mandrel is stopped adjacent to the corona discharge plate and rotated at least 360 degrees. The time that a mandrel is stopped adjacent to the corona discharge plate is known as the "dwell" time, i.e., each mandrel "dwells" at a corona discharge plate. The conveyor then advances the next mandrel supporting the cup adjacent the corona discharge plate and the process is repeated. The disadvantage/problem of this apparatus for, and method of, treating the cups is that the start-and-stop motion, which is often identified as "indexing," is slow and causes wear and tear on the apparatus.

There is, therefore, a need for a product support assembly that does not index the work pieces. There is a further need for a product support assembly that processes a large number of work pieces during each minute of operation.

SUMMARY OF THE INVENTION

These needs, and others, are met by at least one embodiment of the disclosed and claimed concept which provides a product support assembly for a pretreatment assembly including a primary support assembly, a primary drive assembly, a number of secondary support assemblies, and a secondary drive assembly. The primary drive assembly is operatively coupled to the primary support assembly. The primary drive assembly imparts a generally constant motion to the primary support assembly. Each secondary support assembly is structured to support a number of work pieces. Each secondary support assembly is movably coupled to the primary support assembly. The secondary drive assembly is operatively coupled to each secondary support assembly. The secondary drive assembly selectively imparts a motion to each secondary support assembly.

In this configuration, the generally constant motion of the primary support assembly ensures that the product support assembly does not index the work pieces. This solves the problems stated above.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
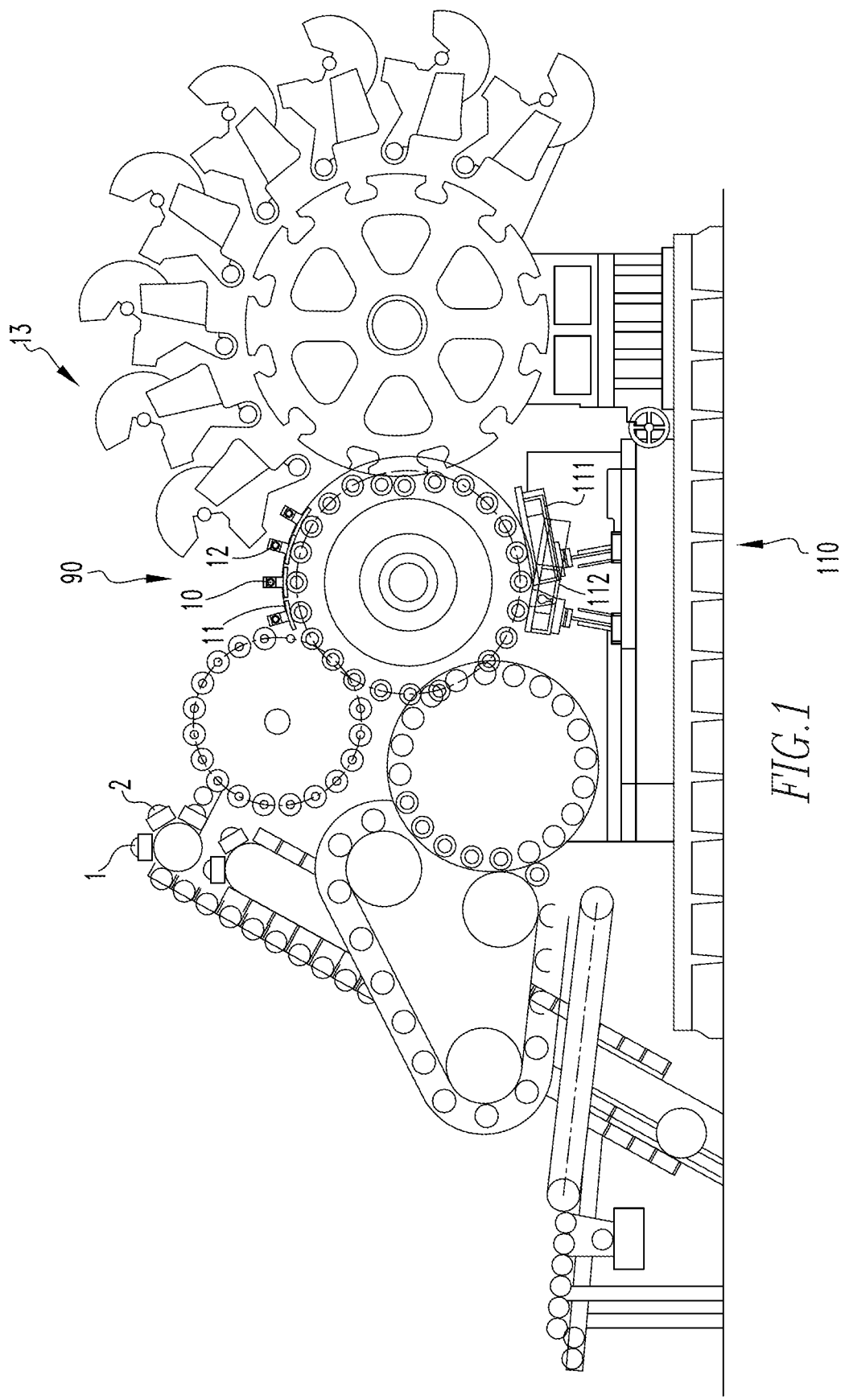
FIG. 1 is a schematic front view of a pretreatment assembly and a post printing treatment assembly.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, the phrase "removably coupled" or "temporarily coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "temporarily disposed" means that a first element(s) or assembly (ies) is resting on a second element(s) or assembly(ies) in a manner that allows the first element/assembly to be moved without having to decouple or otherwise manipulate the first element. For example, a book simply resting on a table, i.e., the book is not glued or fastened to the table, is "temporarily disposed" on the table.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours.

As used herein, a "path of travel" or "path," when used in association with an element that moves, includes the space an element moves through when in motion. As such, any element that moves inherently has a "path of travel" or "path." Further, a "path of travel" or "path" relates to a motion of one identifiable construct as a whole relative to another object. For example, assuming a perfectly smooth road, a rotating wheel (an identifiable construct) on an automobile generally does not move relative to the body (another object) of the automobile. That is, the wheel, as a whole, does not change its position relative to, for example, the adjacent fender. Thus, a rotating wheel does not have a "path of travel" or "path" relative to the body of the automobile. Conversely, the air inlet valve on that wheel (an identifiable construct) does have a "path of travel" or "path" relative to the body of the automobile. That is, while the wheel rotates and is in motion, the air inlet valve as a whole, moves relative to the body of the automobile.

As used herein, the statement that two or more parts or components "engage" one another means that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality).

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, a "radial side/surface" for a circular or cylindrical body is a side/surface that extends about, or encircles, the center thereof or a height line passing through the center thereof. As used herein, an "axial side/surface" for a circular or cylindrical body is a side that extends in a plane extending generally perpendicular to a height line passing through the center. That is, generally, for a cylindrical soup can, the "radial side/surface" is the generally circular sidewall and the "axial side(s)/surface(s)" are the top and bottom of the soup can.

As used herein, "generally curvilinear" includes elements having multiple curved portions, combinations of curved portions and planar portions, and a plurality of planar portions or segments disposed at angles relative to each other thereby forming a curve.

As used herein, "generally" means "in a general manner" relevant to the term being modified as would be understood by one of ordinary skill in the art.

As used herein, "substantially" means "for the most part" relevant to the term being modified as would be understood by one of ordinary skill in the art.

As used herein, "at" means on and/or near relevant to the term being modified as would be understood by one of ordinary skill in the art.

Figure 2:
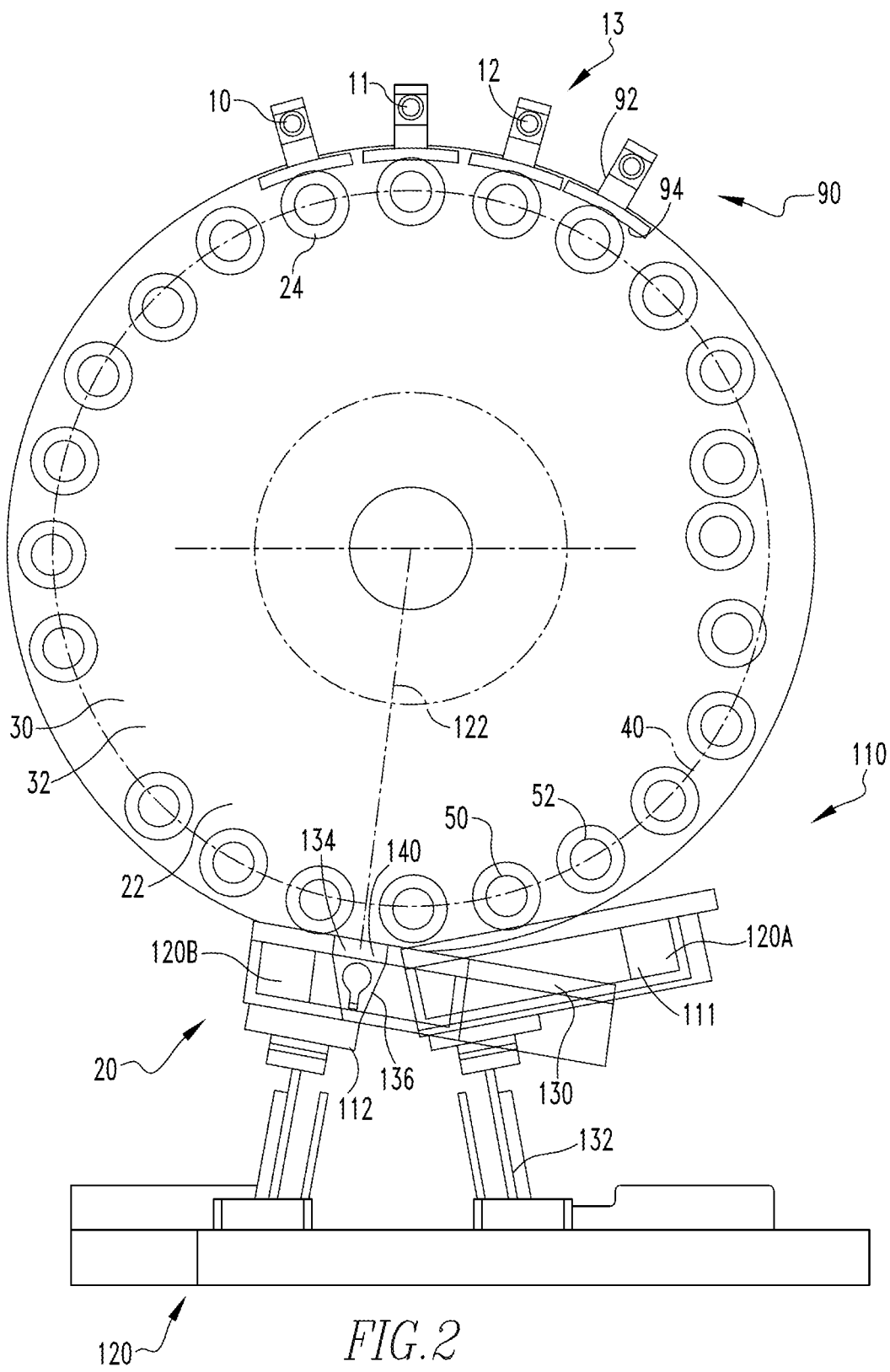
FIG. 2 is a schematic front view of a turret assembly with pretreatment assembly and a post printing treatment assembly.
Figure 3:
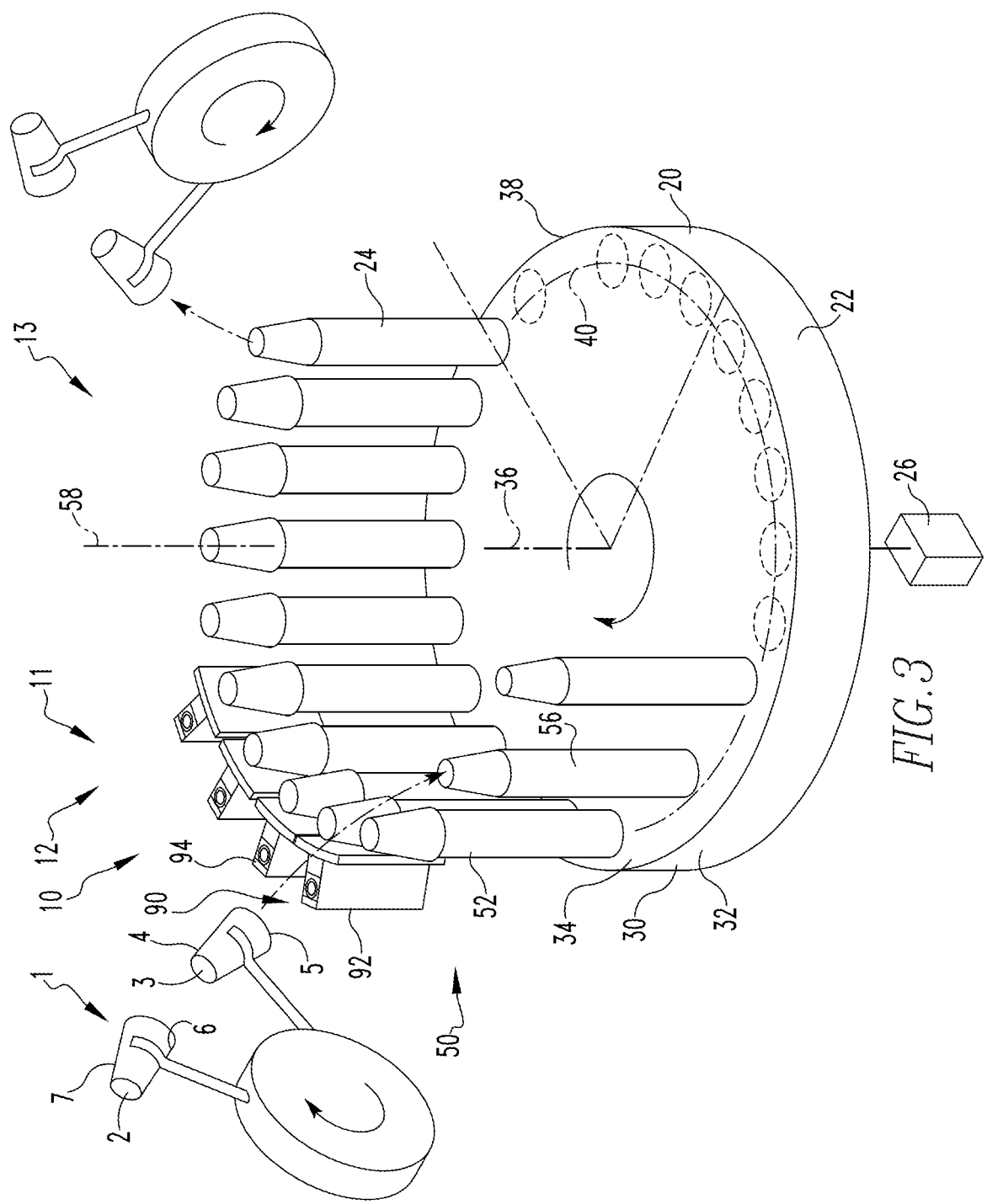
FIG. 3 is a schematic isometric view of a pretreatment assembly.

A pretreatment assembly 10 and a post printing treatment assembly 110 for a decorator are shown in FIGS. 1 and 2. In an exemplary embodiment, the pretreatment assembly 10 is a UV ink pretreatment assembly 11. When identified as a UV ink pretreatment assembly 11, the apparatus is limited to a UV ink pretreatment assembly 11. Further, in an exemplary embodiment, the UV ink pretreatment assembly 11 is a UV ink pretreatment assembly 11 that utilizes a corona to treat the UV ink That is, the pretreatment assembly 10 includes a pretreatment device 12 structured to "treat" the work pieces 1. As used herein, to "treat" means to subject a work piece to an agent or action in order to bring about a particular result. In an exemplary embodiment, the pretreatment device 12 includes a number of stations 13 which, in an exemplary embodiment, are ion generating stations 90, as discussed below. The pretreatment assembly 10 also includes a product support assembly 20. The pretreatment assembly 10, in an exemplary embodiment, includes other elements such as a frame assembly or housing assembly, an infeed assembly structured to dispose work pieces 1 on the product support assembly 20 and a take-away assembly structured to remove work pieces 1 from the product support assembly 20, none numbered. As used herein, a "work piece" is one of a number of constructs upon which work is performed. A "work piece" is not part of the disclosed and claimed concept but rather a construct upon which the pretreatment assembly 10 performs a number of operations. In an exemplary embodiment, the work pieces 1 are plastic cups 2. A plastic cup 2 includes a bottom 3, a sidewall 4 defining a generally enclosed space 5 (FIG. 3). That is, the cup 2, i.e., the bottom 3 and sidewall 4 define a space 5 that is enclosed on all sides but one which is, as used herein, a "generally enclosed space." The cup sidewall 4 has an inner side 6 and an outer side 7. The cup 2 is a unitary body. In an exemplary embodiment, the cup sidewall 4 is outwardly tapered from the bottom 3. Further, as used herein, the terms "inner side" 6 and "outer side" 7 are also usable with a work piece 1 as applicable.

The product support assembly 20 is structured to move a number of work pieces 1 over a path of travel. In an exemplary embodiment, and as shown in FIG. 3, the product support assembly 20 includes a primary support assembly 22 and a number of secondary support assemblies 24 as well as a primary drive assembly 26 and a secondary drive assembly 28. For example, a primary support assembly 22 could be a conveyor belt and the secondary support assemblies 24 could be brackets coupled to the conveyor belt, neither shown. In an exemplary embodiment, the primary support assembly 22 is a turret assembly 30. The turret assembly 30, in an exemplary embodiment, includes a disk-like body 32 having a generally circular front surface 34. The turret assembly body 32 is rotatably coupled to a frame assembly and is structured to rotate relative thereto. That is, the turret assembly body 32 has an axis of rotation 36. Further, the turret assembly body 32 has an outer radius 38 as well as a first radius 40. In an embodiment wherein the secondary support assemblies 24 are directly coupled to the turret assembly body front surface 34, the first radius 40 is smaller than the outer radius 38. In another embodiment, not shown, the secondary support assemblies 24 are coupled to the radial side of the turret assembly body 32 and extend radially therefrom; in this embodiment, the first radius 40 is the same as the outer radius 38. The turret assembly body 32 is structured to support each secondary support assembly 24 at the first radius 40. It is noted that during printing, as shown in FIG. 1, each secondary support assembly 24 moves radially toward the turret assembly body axis of rotation 36. Further, it is noted that FIG. 3 shows an embodiment with only a pretreatment assembly 10.

In this exemplary embodiment, the secondary support assemblies 24 are rotatable mandrel assemblies 50. Each mandrel assembly 50 includes an elongated body 52 having a first end 54 and a second end 56. Each mandrel assembly body 52, and in an exemplary embodiment, each mandrel assembly body first end 54, is rotatably coupled to the turret assembly body 32. In the exemplary embodiment shown, each mandrel assembly body 52 is rotatably coupled to the turret assembly body front surface 34. In this configuration, each mandrel assembly body 52 longitudinal axis extends generally parallel to the turret assembly body axis of rotation 36. It is noted that in an embodiment, not shown, wherein each mandrel assembly body 52 extends radially from the primary support assembly 22, each mandrel assembly body 52 longitudinal axis extends generally perpendicular to the turret assembly body axis of rotation 36. Further, in the configuration shown, each mandrel assembly body 52 has an axis of rotation 58 that is generally parallel to the turret assembly body axis of rotation 36. That is, each mandrel assembly body 52 longitudinal axis is also its axis of rotation 58. Further, in an exemplary embodiment, the mandrel assembly body second end 56 corresponds to the work piece inner side 6. That is, in this exemplary embodiment, the mandrel assembly body second end 56 is tapered.

In an exemplary embodiment, secondary support assemblies 24 include a pressure assembly 60, shown schematically. The pressure assembly 60 includes a pressure generating assembly and a number of pressure conduits, neither shown. The pressure conduits extend through each mandrel assembly body 52 and have a port on the surface thereof, not shown. The pressure conduits are in fluid communication with the pressure generating assembly. The pressure generating assembly is structured to apply a negative pressure, i.e., suction, and/or a positive pressure. Thus, when a work piece 1 is disposed on a mandrel assembly body 52, and during treatment operations, the pressure generating assembly applies a negative pressure (suction) that maintains the work piece 1 on the mandrel assembly body 52. After treatment operations are over, the pressure generating assembly applies a positive pressure that ejects the work piece 1 from the mandrel assembly body 52.

The primary drive assembly 26 is structured to, and does, operatively engage the primary support assembly 22 and cause the primary support assembly 22 to move at one of a "constant speed," a "substantially constant speed," or a "generally constant speed." As used herein, a "constant speed" means that the primary support assembly 22 moves at a set and sustained speed during operation of the primary drive assembly 26 with no variation in the speed. As used herein, a "substantially constant speed" means that the primary support assembly 22 moves at a set and sustained speed during operation of the primary drive assembly 26 with minimal variation in the speed. As used herein, "minimal variation in the speed" means that the speed at which primary support assembly 22 moves may vary by about 10% of the set speed. As used herein, a "generally constant speed" means that the primary support assembly 22 moves at a set and sustained speed during operation of the primary drive assembly 26 with some variation in the speed. As used herein, "some variation in the speed" means that the speed at which primary support assembly 22 moves may vary by about 20% of the set speed. Further, none of a "constant speed," a "substantially constant speed," or a "generally constant speed" includes stopping the rotation of the primary support assembly 22 intermittently. That is, if the primary support assembly 22 "indexes," then the primary support assembly 22 is not moving at a "constant speed," a "substantially constant speed," or a "generally constant speed."

In an exemplary embodiment, wherein the primary support assembly 22 is a turret assembly 30, the primary drive assembly 26 is structured to cause the turret assembly body 32 to rotate about the turret assembly body axis of rotation 36. That is, the primary drive assembly 26 is structured to, and does, impart a constant motion to the primary support assembly 22. The primary drive assembly 26, shown schematically, includes a motor with an output shaft, neither shown. The output shaft is coupled, directly coupled, or fixed to the turret assembly body 32 and actuation of the motor causes the turret assembly body 32 to rotate. In an exemplary embodiment, the speed of the primary drive assembly motor 26 is adjustable, as discussed below. In an exemplary embodiment, the primary drive assembly 26 is structured to cause the turret assembly body 32 to rotate about the turret assembly body axis of rotation 36 so that a point on the first radius 40 (hereinafter shortened to "so that the first radius") moves at one of a "rapid speed," a "very rapid speed," or an "exceedingly rapid speed." As used herein, a "rapid speed" means at least 33 RPM. As used herein, a "very rapid speed" means at least 41 RPM. As used herein, an "exceedingly rapid speed" means at least 50 RPM.

As noted above, each mandrel assembly body 52 is rotatably coupled to the turret assembly body 32. Further, the secondary drive assembly 28 is structured to, and does, operatively engage each secondary support assembly 24, in this embodiment each mandrel assembly body 52, i.e., each mandrel assembly body first end 54, and causes each secondary support assembly 24 to rotate about its axis of rotation. That is, the secondary drive assembly 28 is structured to, and does, impart a constant motion to the secondary support assembly 24. Thus, as the turret assembly body 32 rotates about the turret assembly body axis of rotation 36, each mandrel assembly body 52 also rotates about its own mandrel assembly body axis of rotation 58. In an exemplary embodiment, the secondary drive assembly 28, shown schematically, includes a motor with an output shaft and a drive belt (none shown). The secondary drive assembly 28 also includes elements associated with a belt drive such as guides, guide wheels, and a tensioner, none shown. It is understood that the each mandrel assembly body first end 54 includes, or acts as, a coupling (not shown) that is structured to be operatively engaged by the drive belt. The secondary drive assembly 28 is structured to cause each mandrel assembly body 52 to rotate at least one full revolution (360 degrees about the mandrel assembly body axis of rotation 58) in the time it takes the turret assembly body 32 to move adjacent an ionization surface 94, described below. In an exemplary embodiment, the speed of the secondary drive assembly 28 is adjustable, as discussed below.

The ion generating stations 90, four shown, are structured to ionize an adjacent construct or the surface of an adjacent construct, such as, but not limited to a work piece 1. The ion generating stations 90 are disposed along the secondary support assembly 24 path of travel between the infeed assembly and the take-away assembly. In an exemplary embodiment, the ion generating stations 90 are disposed in series and immediately adjacent each other, as shown in FIG. 1. In an exemplary embodiment, each ion generating station 90 is a corona discharge assembly 92. Each ion generating station 90 includes an ionization surface 94. Each ionization surface 94 extends generally parallel to a mandrel assembly body 52 path of travel. That is, a mandrel assembly body 52 path of travel is the path about the turret assembly body axis of rotation 36. In an exemplary embodiment, each ionization surface 94 is disposed adjacent, or immediately adjacent, the first radius 40. Further, each ionization surface 94 is spaced an "effective distance" from the mandrel assembly body second end 56 path of travel. As used herein, the "effective distance" is the distance wherein a specific ionization surface 94 causes the required amount of ionization to the work piece. That is, the "effective distance" varies by the type of ionization surface 94, the material of the work piece and the rotational speeds of the primary support assembly 22 and/or the each secondary support assembly 24.

In an embodiment wherein the secondary support assembly 24 path of travel is circular, (as when each secondary support assembly 24 is coupled to a rotating turret assembly 30) each ionization surface 94 is generally curvilinear, or, generally arcuate with a center corresponding to the turret assembly body axis of rotation 36. Further, when the mandrel assembly body second ends 56 are tapered, as described above, or when the work piece outer surface, such as cup sidewall outer side 7, is tapered, each ionization surface 94 is angled relative to the turret assembly body axis of rotation 36 so that each ionization surface 94 is generally parallel to a cup sidewall outer side 7 when the cup 2 is disposed on a mandrel assembly body second end 56.

Further, in one exemplary embodiment, not shown, the primary drive assembly 26 and the secondary drive assembly 28 are operatively coupled so that the speed of the secondary drive assembly 28 is a function of primary drive assembly 26. Thus, in this embodiment, the speed of rotation of the turret assembly body 32 and each mandrel assembly body 52 are related. Further, in an exemplary embodiment, the speed of rotation of each mandrel assembly body 52 is generally similar regardless of the radius of the mandrel assembly bodies 52 coupled to the turret assembly body 32. That is, for cups of a first size, the mandrel assembly bodies 52 have a first radius, and, for cups of a different second size, the mandrel assembly bodies 52 have a different, second radius. Regardless of the size to the mandrel assembly bodies 52, the mandrel assembly bodies 52 rotate about their own axis at generally the same speed. In another exemplary embodiment, the speed of rotation for the turret assembly 30 and the mandrel assembly bodies 52 changes depending upon the size/shape of the cup 2 to be processed. In this exemplary embodiment, the primary drive assembly 26 and the secondary drive assembly 28 are independently operable. As used herein, "independently operable" means that the speed of rotation that the primary drive assembly 26 imparts to the primary support assembly 22 is separate from, i.e., not related by a mathematical function to, the speed of rotation that the secondary drive assembly 28 imparts to the secondary support assembly 24. In this embodiment, the speed of rotation of each mandrel assembly body 52 about its own axis is selectable and is related to the radius of the mandrel assembly body 52.

The pretreatment assembly 10 operates as follows. The primary drive assembly 26 operatively engages the turret assembly 30 causing the turret assembly body 32 to rotate about the turret assembly body axis of rotation 36 at one of a "constant speed," a "substantially constant speed," or a "generally constant speed." Further, the secondary drive assembly 28 operatively engages each mandrel assembly body 52 causing each mandrel assembly body 52 to rotate about its own mandrel assembly body axis of rotation 58. An infeed assembly (not shown), which is disposed adjacent the turret assembly body 32, disposes a cup 2 on each mandrel assembly body second end 56 as each mandrel assembly body 52 moves adjacent the infeed assembly. In an exemplary embodiment, the pressure assembly 60 is engaged with negative pressure to bias the cup 2 to the associated mandrel assembly body second end 56. As each mandrel assembly body 52 moves along its path of travel, each cup 2 passes by, within an effective distance of, each ion generating station 90 and its ionization surface 94. As the cup 2 passes by the ion generating stations 90, the cup sidewall outer side 7 is ionized. Each mandrel assembly body 52 then moves to the take-away assembly wherein the associated cup 2 is removed from the mandrel assembly body second end 56. This process is repeated as the turret assembly body 32 rotates.

It is noted that the speed of rotation for the turret assembly body 32 and the mandrel assembly bodies 52 is determined, as is known in the art, by the material being treated, the size of the first radius 40, and the radius of the mandrel assembly bodies 52 and/or the cup 2 disposed thereon. In an exemplary embodiment, however, the turret assembly body 32 rotates so that the first radius 40 moves at one of a "quick speed," a "rapid speed," or a "swift speed" and at one of a "constant speed," a "substantially constant speed," or a "generally constant speed." Because the primary support assembly 22 does not index, the problem(s) stated above are solved.

In this configuration, the pretreatment assembly 10 is structured to, and does, process one of a "large number" of work pieces 1 per minute, a "very large number" of work pieces 1 per minute, or an "exceedingly large number" of work pieces 1 per minute. Stated alternately, the product support assembly 20 is structured to, and does, pass one of a "large number" of work pieces 1 per minute, a "very large number" of work pieces 1 per minute, or an "exceedingly large number" of work pieces 1 per minute adjacent the ion generating stations 90 at an effective distance. As used herein, a "large number" of work pieces 1 per minute means at least 800 work pieces 1 per minute. As used herein, a "very large number" of work pieces 1 per minute means at least 1000 work pieces 1 per minute. As used herein, an "exceedingly large number" of work pieces 1 per minute means at least 1200 work pieces 1 per minute. Processing of a "large number" of work pieces 1 per minute, a "very large number" of work pieces 1 per minute, or an "exceedingly large number" of work pieces 1 per minute solves the problem(s) stated above.

Further, as used herein, "processing" work pieces 1 means that a work piece moves from a location external to the product support assembly 20 (e.g., from an infeed assembly), is treated by the ion generating stations 90 and is ejected from the product support assembly 20. Further, in an exemplary embodiment, no secondary support assembly 24 dwells at any ion generating station 90. That is, because the primary support assembly 22 moves at one of a "constant speed," a "substantially constant speed," or a "generally constant speed," no secondary support assembly 24 dwells at any ion generating station 90. This solves the problem(s) stated above. Stated alternately, the product support assembly 20 passes one of a "large number" of work pieces 1 per minute, a "very large number" of work pieces 1 per minute, or an "exceedingly large number" of work pieces 1 per minute adjacent the ion generating stations 90. It is understood that, as used herein, to "pass a number of work pieces 1 adjacent the ion generating stations 90" means that the work pieces 1 move adjacent to the ion generating stations 90 with the ion generating stations 90 acting on the work pieces 1. That is, to "pass a number of work pieces 1 adjacent the ion generating stations 90" does not mean, for example, that work pieces 1 in a box on a truck, or on another machine, move in the vicinity of the ion generating stations 90.

Figure 4:
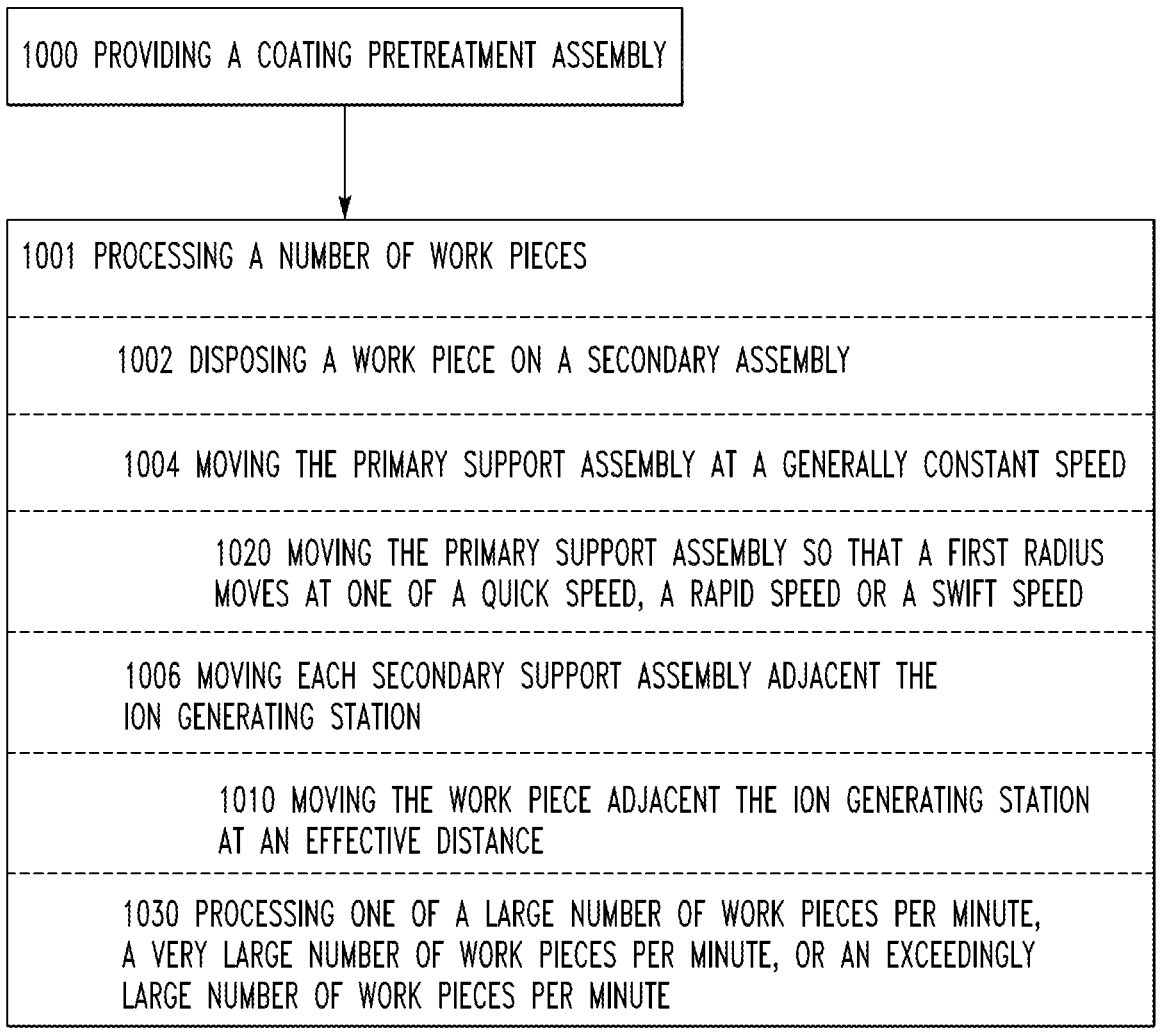
FIG. 4 is a flow chart of the disclosed pretreatment method.

Accordingly, as shown in FIG. 4, a method of processing work pieces 1 using the pretreatment assembly 10 described above includes providing 1000 a pretreatment assembly 10 including a product support assembly, a number of ion generating stations, each ion generating station disposed adjacent the product support assembly, the product support assembly including a primary support assembly, a primary drive assembly, a number of secondary support assemblies, and a secondary drive assembly, the primary drive assembly operatively coupled to the primary support assembly, wherein the primary drive assembly imparts a constant motion to the primary support assembly, each secondary support assembly structured to support a number of work pieces, each secondary support assembly movably coupled to the primary support assembly, the secondary drive assembly operatively coupled to each secondary support assembly, wherein the secondary drive assembly selectively imparts a motion to each secondary support assembly (hereinafter shortened to "providing 1000 a pretreatment assembly 10") and processing 1001 a number of work pieces 1. Processing 1001 a number of work pieces 1 includes disposing 1002 a work piece 1 on a secondary support assembly 22, moving 1004 the primary support assembly 22 at a generally constant speed, and moving 1006 each secondary support assembly 24 adjacent the ion generating stations 90.

Further, moving 1006 the each secondary support assembly 24 adjacent the ion generating stations 90 includes moving 1010 the work piece 1 adjacent the ion generating stations 90 at an effective distance.

Further, moving 1004 the primary support assembly 22 at a generally constant speed includes moving 1020 the primary support assembly 22 so that a first radius 40 moves at one of a quick speed, a rapid speed, or a swift speed. It is noted that moving 1020 the primary support assembly 22 so that a first radius 40 on the primary support assembly moves at one of a quick speed, a rapid speed, or a swift speed solves the problem(s) stated above.

Further, processing 1001 a number of work pieces 1 includes processing 1030 one of a large number of work pieces 1 per minute, a very large number of work pieces 1 per minute, or an exceedingly large number of work pieces 1 per minute. It is noted that processing 1030 one of a large number of work pieces 1 per minute, a very large number of work pieces 1 per minute, or an exceedingly large number of work pieces 1 per minute solves the problem(s) stated above.

Figure 5:
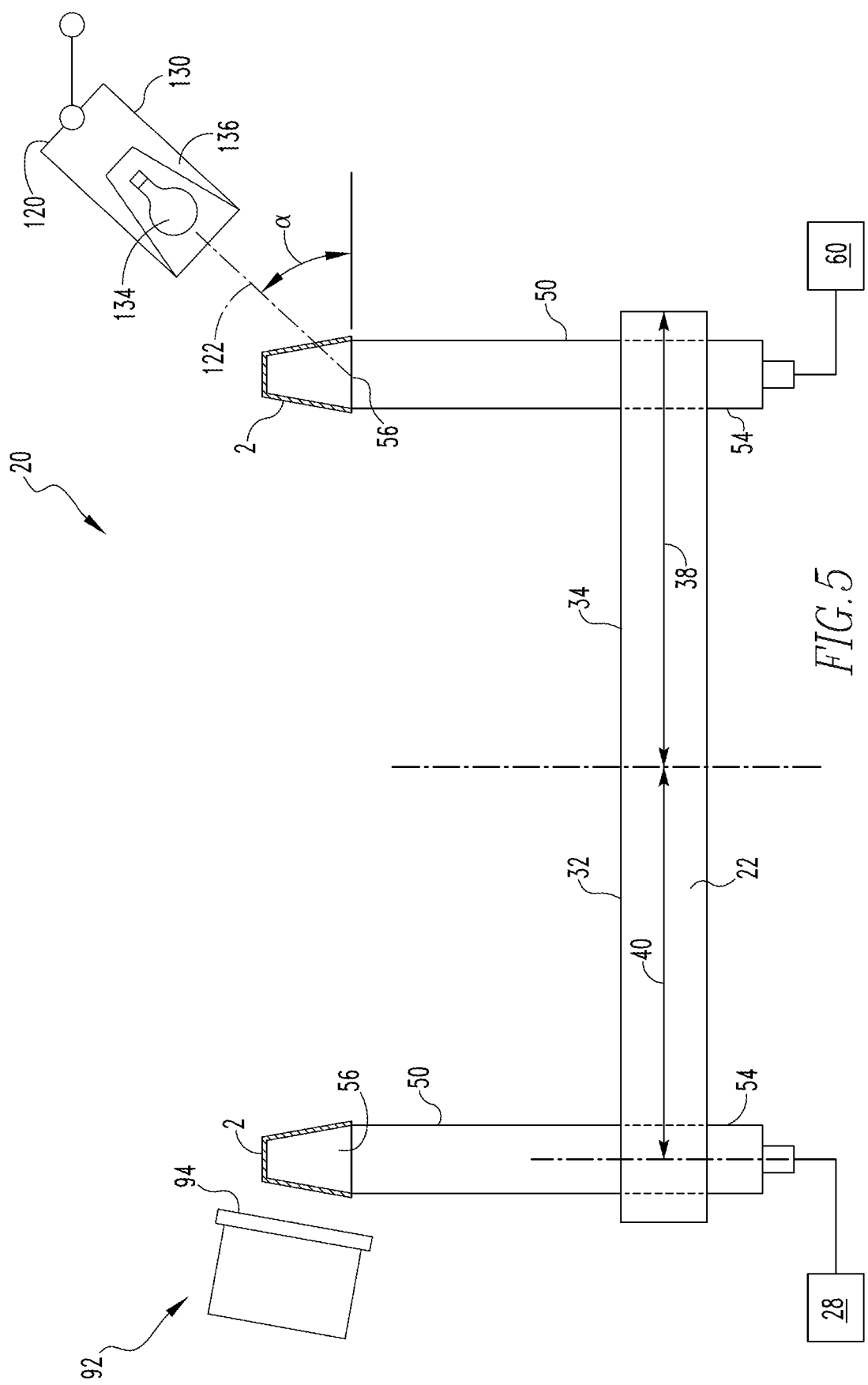
FIG. 5 is a side view of a post printing treatment assembly.

In another exemplary embodiment, the product support assembly 20 described above is incorporated into a post printing treatment assembly 110 is shown in FIGS. 1, 2, and 5. A post printing treatment assembly 110 also includes a post printing treatment device 112 including a number of stations 113. The post printing treatment device stations 113 are disposed adjacent the product support assembly 20. In an exemplary embodiment, the post printing treatment assembly 110 is a UV ink curing assembly 111. When identified as a UV ink curing assembly 111, the apparatus is limited to a UV ink curing assembly 111. That is, in this embodiment, the post printing treatment device stations 113 include a number of ultraviolet (UV) lamps 120. In this embodiment, the product support assembly 20 is assembled and operated substantially as described above.

In this exemplary embodiment, the product support assembly 20 again moves at one of a "constant speed," a "substantially constant speed," or a "generally constant speed" as those terms are defined above. Thus, in this embodiment, no secondary support assembly 24 dwells at any post printing treatment device station 113. That is, as shown, no secondary support assembly 24 dwells at any UV lamp 120, as described below. Further, in this embodiment, the primary drive assembly 26 is structured to cause the turret assembly body 32 to rotate about the turret assembly body axis of rotation 36 so that a point on the first radius 40 (hereinafter shortened to "so that the first radius") moves at one of a "high speed," a "very high speed," or an "exceedingly high speed." As used herein, a "high speed" means at least 30 RPM. As used herein, a "very high speed" means at least 40 RPM. As used herein, an "exceedingly high speed" means at least 50 RPM.

In an exemplary embodiment, the post printing treatment device 112 includes a number of ultra-violet (UV) lamps 120. Each UV lamp 120 includes a housing 130, a mounting 132, and a light generating device hereinafter identified as a "bulb" 134. It is understood that, as used herein, a "bulb" means any device that produces light and is not limited to a vacuum bulb associated with incandescent lights. Each UV lamp 120, in an exemplary embodiment, also includes a reflector 136 structured to generally, or substantially, reflect and concentrate the light generated by the UV lamp bulb 134 in a beam having a longitudinal axis 122, hereinafter "light beam longitudinal axis" 122, which is shown schematically. As used herein, a light beam longitudinal axis 122 extends, generally, at the center of a conical or cylindrical beam. The UV lamp bulb 134 and UV lamp reflector 136 are disposed in the UV lamp housing 130. The UV lamp housing 130 is coupled, directly coupled, or fixed to the UV lamp mounting 132. In an exemplary embodiment, the UV lamp mounting 132 includes a movable coupling (not shown) structured to allow adjustment of the direction of the light beam longitudinal axis 122. Further, in an exemplary embodiment, each UV lamp 120 includes a focus adjustment device 140 such as, but not limited to a lens (not shown).

The UV lamps 120 are disposed adjacent the work piece 1 path of travel. That is, UV lamps 120 are disposed adjacent the secondary support assembly 24 path of travel and, in an exemplary embodiment, adjacent the mandrel assembly body second end 56 path of travel. Further, in an exemplary embodiment, the UV lamps 120 are structured to, and do, emit a beam UV light in one of a "generally defined direction," a "substantially defined direction," or a "specifically defined direction." As used herein, a "generally defined direction" means that the emitted light is confined to a beam in the manner of typical incandescent flashlight wherein light reflected by a generally conical reflector fades at the edge of the beam and the beam generally scatters. As used herein, a "substantially defined direction" means that the emitted light is confined to a beam in the manner of controlled focus flashlight, such as, but not limited to, a flashlight with a LED wherein the edge of the light beam is clearly defined with minimal scattering. As used herein, a "specifically defined direction" means that the emitted light is confined to a beam similar to a laser or other highly focused light beam wherein the edge of the light beam is clearly defined with negligible scattering.

In an exemplary embodiment, the UV lamps 120 shine, generally, in a radial manner relative to the primary support assembly 22. That is, with a generally circular turret assembly body 32, each light beam longitudinal axis 122 extends generally through, or at, the turret assembly body axis of rotation 36. Further, the UV lamps 120 are structured to allow, and do allow, the alteration the elevation angle "a" of the light beam longitudinal axis 122. As used herein, the "elevation angle" of the light beam is the angle of the light beam longitudinal axis 122 relative to a plane that is generally perpendicular to the turret assembly body axis of rotation 36. For example, in an embodiment wherein the turret assembly body front surface 34 is generally perpendicular to the turret assembly body axis of rotation 36, the "elevation angle" is measured relative to the plane of the turret assembly body front surface 34. In an exemplary embodiment, the UV lamps 120 are structured to, and do, alter the elevation angle "a" of the light beam longitudinal axis 122 between about 0 and 12 degrees. Changing the elevation angle allows the light beam longitudinal axis 122 to be generally or substantially normal, i.e., generally or substantially ninety degrees to, the outer surface of a work piece 1 when the work piece 1 is tapered. Thus, in an embodiment wherein the work piece 1 is a tapered cup 2, each UV lamp light beam longitudinal axis 122 extends generally normal to the work piece 1 outer side, i.e., cup sidewall outer side 7.

Each UV lamp focus adjustment device 140 is structured to, and does, allow adjustment of a UV lamp 120 focal length. As used herein, the "focal length" of a light is the distance wherein the light beam is concentrated. To solve the problems stated above, each UV lamp focus adjustment device 140 is structured to, and does, adjust the associated UV lamp 120 focal length to a "fuzzy focus." As used herein, a "fuzzy focus" is a focus generally at the "critical focus" of each UV lamp 120. That is, each UV lamp 120 is not set to its "critical focus." In an alternate embodiment, each UV lamp focus adjustment device 140 is structured to, and does, adjust the associated UV lamp 120 focal length to a "blurry focus." As used herein, a "blurry focus" is a focus substantially at the "critical focus" of each UV lamp 120. Further, in another exemplary embodiment, each UV lamp 120 is set to its "critical focus."

Further, in an exemplary embodiment, and when there are a plurality of UV lamps 120, the UV lamps 120 are structured to, and do, generate a flood of UV light, or, UV light flood. As used herein, a "flood of UV light," or, a "UV light flood" means that a plurality of UV lamps 120 project beams of UV light wherein the focal length of each UV lamp 120 is different. In this embodiment, the UV light flood is sufficient to cure the UV ink. Thus, each mandrel assembly body second end 56 passes through said UV light flood. Stated alternately, each mandrel assembly body second end 56 path of travel extends through the UV light flood. In an exemplary embodiment, each mandrel assembly body second end 56 path of travel extends through each UV light beam fuzzy focus.

Further, in one exemplary embodiment, each mandrel assembly body 52 moves one full rotation about its axis while the mandrel assembly body 52 is generally adjacent each UV lamp 120, i.e. the mandrel assembly body 52 rotates once during the dwell time for each UV lamp 120. That is, each UV lamp 120 projects a beam of UV light in a defined area, and, the rotational speed for each mandrel assembly body 52 is set so that each mandrel assembly body 52 moves one full rotation about its axis while the mandrel assembly body 52 is within the beam of UV light from each UV lamp 120. In another embodiment, each mandrel assembly body 52 moves one full rotation about its axis while the mandrel assembly body 52 is in the flood of UV light. In another embodiment, each mandrel assembly body 52 moves a plurality of rotations about its axis while the mandrel assembly body 52 is in the flood of UV light.

In an exemplary embodiment, the number of UV lamps 120 includes a first UV lamp 120A and second UV lamp 120B. In an exemplary embodiment, the first UV lamp 120A and second UV lamp 120B are placed in the closest possible proximity in the direction of turret assembly body 32 rotation. In this configuration, the work piece 1 exposure to the second UV lamp 120B takes place while the polymerization of a UV ink started by the first UV lamp 120A is still taking place, allowing for more curing effect from the second UV lamp 120B. That is, in this configuration, the post printing treatment assembly 110 is structured to, and does, perform a multi-lamp cure. As used herein, a "multi-lamp cure" means that a UV curable ink disposed on a work piece 1 is cured by more than one UV lamp 120 while the work piece 1 is in constant motion moving by the UV lamps 120. Further, as used herein, a "constant motion" means that the primary support assembly 22 moves at one of a "constant speed," a "substantially constant speed," or a "generally constant speed" as defined above. Further, as used herein, a "constant motion" cannot be achieved by a mandrel body spinning about its own axis while the mandrel body axis of rotation does not move relative to a UV lamp.

In this configuration, the post printing treatment assembly 110 is structured to, and does, process one of a "lame number" of work pieces 1 per minute, a "very large number" of work pieces 1 per minute, or an "exceedingly large number" of work pieces 1 per minute. Stated alternately, the product support assembly 20 is structured to, and does, pass one of a "large number" of work pieces 1 per minute, a "very large number" of work pieces 1 per minute, or an "exceedingly large number" of work pieces 1 per minute adjacent the UV lamps 120. Processing of a "large number" of work pieces 1 per minute, a "very large number" of work pieces 1 per minute, or an "exceedingly large number" of work pieces 1 per minute solves the problem(s) stated above.

Further, as used herein, and in the context of a post printing treatment assembly 110, "processing" work pieces 1 means that a work piece moves from a location external to the product support assembly 20 (e.g., from an infeed assembly), is treated by a UV lamp 120 and is ejected from the product support assembly 20. Further, in an exemplary embodiment, no secondary support assembly 24 dwells at any UV lamp 120. That is, because the primary support assembly 22 moves at one of a "constant speed," a "substantially constant speed," or a "generally constant speed," no secondary support assembly 24 dwells at any UV lamp 120. This solves the problem(s) stated above. Stated alternately, the product support assembly 20 passes one of a "large number" of work pieces 1 per minute, a "very large number" of work pieces 1 per minute, or an "exceedingly large number" of work pieces 1 per minute adjacent the UV lamp 120. It is understood that, as used herein, to "pass a number of work pieces 1 adjacent the UV lamp(s) 120" means that the work pieces 1 move adjacent to the UV lamp 120 with the UV lamp(s) 120 treating the work pieces 1. That is, to "pass a number of work pieces 1 adjacent the UV lamp(s) 120" does not mean, for example, that work pieces 1 in a box on a truck, or on another machine, move in the vicinity of the UV lamp(s) 120.

Figure 6:
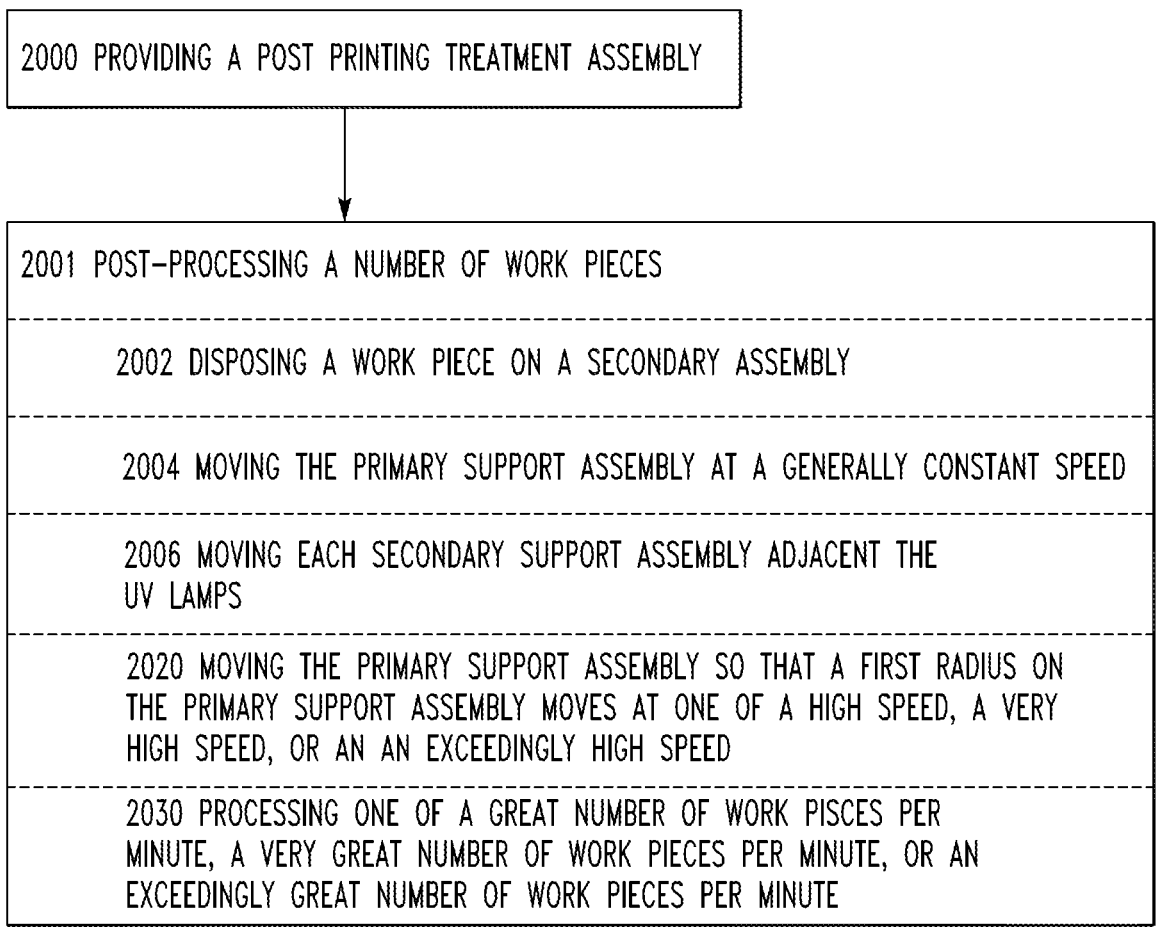
FIG. 6 is a flow chart of the disclosed post printing treatment method.

Accordingly, as shown in FIG. 6, a method of processing work pieces 1 using the post printing treatment assembly 110 described above includes providing 2000 a post printing treatment assembly 110 including a product support assembly and a number of UV lamps 120, each UV lamp 120 disposed adjacent the product support assembly, the product support assembly including a primary support assembly, a primary drive assembly, a number of secondary support assemblies, and a secondary drive assembly, the primary drive assembly operatively coupled to the primary support assembly, wherein the primary drive assembly imparts a constant motion to the primary support assembly, each secondary support assembly structured to support a number of work pieces, each secondary support assembly movably coupled to the primary support assembly, the secondary drive assembly operatively coupled to each secondary support assembly, wherein the secondary drive assembly selectively imparts a motion to each secondary support assembly (hereinafter shortened to "providing 2000 a post printing treatment assembly 110"), and post-processing 2001 a number of work pieces 1. Post-processing 2001 a number of work pieces 1 includes disposing 2002 a work piece 1 on a secondary support assembly 22, moving 2004 the primary support assembly 22 at a generally constant speed, and moving 2006 each secondary support assembly 24 adjacent the UV lamps 120.

Further, moving 2004 the primary support assembly 22 at a generally constant speed includes moving 2020 the primary support assembly 22 so that a first radius on the primary support assembly 22 moves at one of a high speed, a very high speed, or an exceedingly high speed.

Further, post-processing 2001 a number of work pieces 1 includes processing one of a large number of work pieces per minute, a very large number of work pieces per minute, or an exceedingly large number of work pieces per minute.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A product support assembly for a pretreatment assembly, said pretreatment assembly structured to process a number of work pieces, said pretreatment assembly including a number of ion generating stations, said product support assembly comprising:
   a primary support assembly;
   a primary drive assembly;
   said primary drive assembly operatively coupled to said primary support assembly;
   wherein said primary drive assembly imparts a constant motion to said primary support assembly;
   a number of secondary support assemblies;
   each secondary support assembly structured to support a number of work pieces;
   each secondary support assembly movably coupled to said primary support assembly;
   a secondary drive assembly;
   said secondary drive assembly operatively coupled to each secondary support assembly; and
   wherein said secondary drive assembly selectively imparts a motion to each secondary support assembly.

2. The product support assembly of claim 1 wherein:
   said primary support assembly is a turret assembly;
   said turret assembly including a body structured to support each secondary support assembly at a first radius;
   said turret assembly body having an axis of rotation;
   each secondary support assembly coupled to said turret assembly at said first radius; and
   said primary drive assembly structured to rotate said turret assembly body so that said first radius moves at one of a rapid speed, a very rapid speed, or an exceedingly rapid speed.

3. The product support assembly of claim 2 wherein:
   each secondary support assembly is a mandrel assembly;
   each mandrel assembly including an elongated body having a first end and a second end; and
   wherein each mandrel assembly body is rotatably coupled to said turret assembly body.

4. The product support assembly of claim 3 wherein each ion generating station includes an ionization surface, each ionization surface having a width, each ionization surface disposed adjacent said turret assembly body first radius, each ionization surface extending generally parallel to a mandrel assembly body path of travel, and wherein:
   each mandrel assembly body second end path of travel is disposed an effective distance from each ionization surface.

5. The product support assembly of claim 4 wherein each ionization surface is generally an inner conical surface and wherein each mandrel assembly body second end is tapered.

6. The product support assembly of claim 4 wherein:
   said primary drive assembly has a first rotational speed; and
   said secondary drive assembly is structured to rotate each mandrel assembly body substantially one full rotation as each mandrel assembly body moves adjacent each ionization surface.

7. The product support assembly of claim 4 wherein no mandrel assembly body dwells at any ion generating station.

8. The product support assembly of claim 3 wherein with each mandrel assembly body axis of rotation extends generally parallel to said turret assembly body axis of rotation.

9. The product support assembly of claim 1 wherein said primary drive assembly and said secondary drive assembly are independently operable.

10. The product support assembly of claim 1 wherein said no secondary support assembly dwells at any ion generating station.

11. A pretreatment assembly comprising:
    a product support assembly;
    a number of ion generating stations;
    each ion generating station disposed adjacent said product support assembly;
    said product support assembly including a primary support assembly, a primary drive assembly, a number of secondary support assemblies, and a secondary drive assembly;
    said primary drive assembly operatively coupled to said primary support assembly;
    wherein said primary drive assembly imparts a constant motion to said primary support assembly;
    each secondary support assembly structured to support a number of work pieces;
    each secondary support assembly movably coupled to said primary support assembly;
    said secondary drive assembly operatively coupled to each secondary support assembly; and
    wherein said secondary drive assembly selectively imparts a motion to each secondary support assembly.

12. The pretreatment assembly of claim 11 wherein:
    said primary support assembly is a turret assembly;
    said turret assembly including a body structured to support each secondary support assembly at a first radius;
    said turret assembly body having an axis of rotation;
    each secondary support assembly coupled to said turret assembly at said first radius; and
    said primary drive assembly structured to rotate said turret assembly body so that said first radius moves at a one of a rapid speed, a very rapid speed, or an exceedingly rapid speed.

13. The pretreatment assembly of claim 12 wherein:
    each secondary support assembly is a mandrel assembly;
    each mandrel assembly including an elongated body having a first end and a second end; and wherein each mandrel assembly body is rotatably coupled to said turret assembly body.

14. The pretreatment assembly of claim 13 wherein each ion generating station includes an ionization surface, each ionization surface having a width, each ionization surface disposed adjacent said turret assembly body first radius, each ionization surface extending generally parallel to a mandrel assembly body path of travel, and wherein:
each mandrel assembly body second end path of travel is disposed an effective distance from each ionization surface.

15. The pretreatment assembly of claim 14 wherein no mandrel assembly body dwells at any ion generating station.

16. The pretreatment assembly of claim 11 wherein said no secondary support assembly dwells at any ion generating station.

17. A pretreatment assembly comprising:
a product support assembly;
a number of ion generating stations;
each ion generating station disposed adjacent said product support assembly;
said product support assembly including a primary support assembly, a primary drive assembly, a number of secondary support assemblies, and a secondary drive assembly;
said primary drive assembly operatively coupled to said primary support assembly;
wherein said primary drive assembly imparts a motion to said primary support assembly;
each secondary support assembly structured to support a number of work pieces;
each secondary support assembly movably coupled to said primary support assembly;
said secondary drive assembly operatively coupled to each secondary support assembly;
wherein said secondary drive assembly selectively imparts a motion to each secondary support assembly; and
wherein said product support assembly passes one of a large number of work pieces per minute, a very large number of work pieces per minute, or an exceedingly large number of work pieces per minute adjacent said ion generating stations at an effective distance.

18. A method of processing a number of work pieces comprising:
providing a pretreatment assembly including a product support assembly, a number of ion generating stations, each ion generating station disposed adjacent said product support assembly, said product support assembly including a primary support assembly, a primary drive assembly, a number of secondary support assemblies, and a secondary drive assembly, said primary drive assembly operatively coupled to said primary support assembly, wherein said primary drive assembly imparts a constant motion to said primary support assembly, each secondary support assembly structured to support a number of work pieces, each secondary support assembly movably coupled to said primary support assembly, said secondary drive assembly operatively coupled to each secondary support assembly, wherein said secondary drive assembly selectively imparts a motion to each secondary support assembly;
processing a number of work pieces including:
disposing a work piece on a secondary support assembly;
moving said primary support assembly at a generally constant speed; and
moving said each secondary support assembly adjacent said ion generating stations.

19. The method of claim 18 wherein moving the primary support assembly at a generally constant speed includes moving the primary support assembly so that a first radius on the primary support assembly moves at one of a rapid speed, a very rapid speed, or an exceedingly rapid speed.

20. The method of claim 18 wherein processing a number of work pieces includes processing one of a large number of work pieces per minute, a very large number of work pieces per minute, or an exceedingly large number of work pieces per minute.

* * * * *